(12) United States Patent
Shizuno

(10) Patent No.: US 7,375,397 B2
(45) Date of Patent: May 20, 2008

(54) SEMICONDUCTOR DEVICE HAVING AN SOI STRUCTURE AND METHOD FOR MANUFACTURING THE SAME

(75) Inventor: Yoshinori Shizuno, Kanagawa prefecture (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 28 days.

(21) Appl. No.: 11/416,076

(22) Filed: May 3, 2006

(65) Prior Publication Data
US 2006/0255408 A1 Nov. 16, 2006

(30) Foreign Application Priority Data
May 13, 2005 (JP) .............................. 2005-141576

(51) Int. Cl.
| | |
|---|---|
| H01L 27/01 | (2006.01) |
| H01L 27/12 | (2006.01) |
| H01L 31/0392 | (2006.01) |
| H01L 23/48 | (2006.01) |
| H01L 23/52 | (2006.01) |
| H01L 29/40 | (2006.01) |

(52) U.S. Cl. ................. 257/347; 257/758; 257/E27.112
(58) Field of Classification Search ................ 257/347, 257/758
See application file for complete search history.

(56) References Cited

U.S. PATENT DOCUMENTS

| 5,696,403 A | * | 12/1997 | Rostoker et al. ............. 257/758 |
| 2004/0207014 A1 | | 10/2004 | Kishiro |
| 2004/0253798 A1 | * | 12/2004 | Mori .......................... 438/517 |

* cited by examiner

Primary Examiner—Cuong Nguyen
(74) Attorney, Agent, or Firm—Rabin & Berdo, PC

(57) ABSTRACT

There is provided a semiconductor device in which the characteristic variations of a transistor and the degradation of a gate oxide layer are reduced during a WP process and a method for manufacturing the same. The semiconductor device includes a semiconductor chip having an SOI transistor. The SOI transistor includes a semiconductor layer comprising device isolating regions, a channel region, and diffusion regions that sandwich the channel region therebetween. The semiconductor layer is formed on a support substrate via a first insulating layer. A gate electrode is formed on the channel region of the semiconductor layer via a second insulating layer. The semiconductor chip has, on the first surface, a first electrode pad electrically connected to the SOI transistor and a second electrode pad electrically connected to the support substrate.

14 Claims, 12 Drawing Sheets

SEMICONDUCTOR DEVICE HAVING AN SOI STRUCTURE AND METHOD FOR MANUFACTURING THE SAME

This application is based on Japanese Patent Application No. 2005-141576 which is hereby incorporated by reference.

BACKGROUND OF THE INVENTION

1. Field of the Invention

The present invention relates to semiconductor devices, and more particularly to a technique having advantages when applied to semiconductor devices having a silicon-on-insulator (SOI) structure.

2. Description of the Related Art

An SOI technique has been used to achieve lower power consumption and higher-speed operability for semiconductor devices. In cases where integrated circuits(ICs) are manufactured using the SOI technique, ICs are manufactured from SOI wafers.

The SOI wafers have a structure in which a semiconductor layer or a device-forming region, and a substrate are isolated from each other by a thick silicon oxide layer (hereinafter, referred to as a buried oxide layer) or a first insulating layer. When transistors are formed in the semiconductor layer of a SOI wafer, the silicon serving as a channel region and a diffusion region is completely insulated from the substrate by the silicon oxide layer.

A transistor formed in the semiconductor layer of the SOI wafer (hereinafter, referred to as an SOI transistor) undergoes characteristic variations when hot carriers generated at the ON state of the SOI transistor are accumulated in the channel region of the SOI transistor. To reduce the variations, a potential of the channel region needs to be fixed to stabilize the action of the SOI transistor. Since ICs are generally sealed by resin or ceramic, it is difficult to establish electrical connection with the substrate. Accordingly, a technique in which in addition to a bonding to a front surface of a IC, another bonding to a metal plate attached to a back surface of the IC is made to fix the electrical potential of the metal plate from the exterior is sometimes used. Another technique of fixing the electrical potential of substrate is sometimes used, in which the back surface of the IC is fixed mechanically and electrically to a conductive layer in which a potential of a package member is fixed, using a conductive paste.

Unless the potential is fixed from the back surface of the IC, electrical connection from the surface of the SOI wafer to the substrate needs to be established in wafer processing. In general SOI-transistor manufacturing processes, for electrical connection from the front surface of the wafer to the substrate, a contact hole is formed through the buried oxide layer, and a conductive material is buried therein.

The technique in which electrical connection is established from the front surface of the IC to the substrate is, for example, disclosed in JP-A-2004-319853.

However, with the technique described in the foregoing related art and the referenced patent, the contact connected to the substrate fixes the potential to a ground, so that the substrate and a terminal in the circuit which is connected to the ground are connected to each other through a wire or a first metal. The substrate becomes charged by the bias applied to a stage due to chemical-vapor deposition (CVD) or etching treatment or the bias of an electrostatic chuck applied to attract the wafer toward a stage. The generated charge is input to the transistor via the contact connected to the substrate. There is therefore a possibility that characteristics variations of the transistor and degrading of the gate oxide layer are triggered.

SUMMARY OF THE INVENTION

It is an object of the present invention to provide a semiconductor device in which the above-described problems are solved and in which characteristic variations of a transistor and the degradation of a gate oxide layer are minimized, and a method for manufacturing the same.

A method for manufacturing a semiconductor device according to a first aspect of the invention includes the steps of: preparing an SOI wafer; forming through holes in the SOI wafer; filling the through holes with conductors; forming a plurality of SOI transistors on the SOI wafer; and forming a first electrode pad electrically connected to each of the SOI transistors and a second electrode pad electrically connected to the conductors.

A semiconductor device according to a second aspect of the invention includes: a support substrate; a buried oxide layer formed on the support substrate; and a semiconductor layer deposited on the buried oxide layer and including device isolating regions and a plurality of device regions isolated by the device isolating regions, each of the plurality of device regions having a channel region and a pair of electrode regions opposed to each other with the channel region sandwiched therebetween; a gate insulating layer; a gate electrode opposed to the channel region via the gate insulating layer to form a transistor in the device region; an interlayer insulating layer covering the gate electrode and the semiconductor layer; and a first through conductor passing through the interlayer insulating layer into electrical connection with the gate electrode; a second through conductor passing through the interlayer insulating layer, the device isolating region, and the buried oxide layer and extending to the support substrate; and a first electrode and a second electrode formed on the interlayer insulating layer and electrically connected to the first through conductor and the second through conductor, respectively.

With the structure of the semiconductor device according to embodiments of the present invention, the characteristic variations of a transistor and the degradation of a gate oxide layer can be minimized.

DETAILED DESCRIPTION OF THE INVENTION

Embodiments of the invention will be specifically described with reference to the drawings.

First Embodiment

Figure 1:
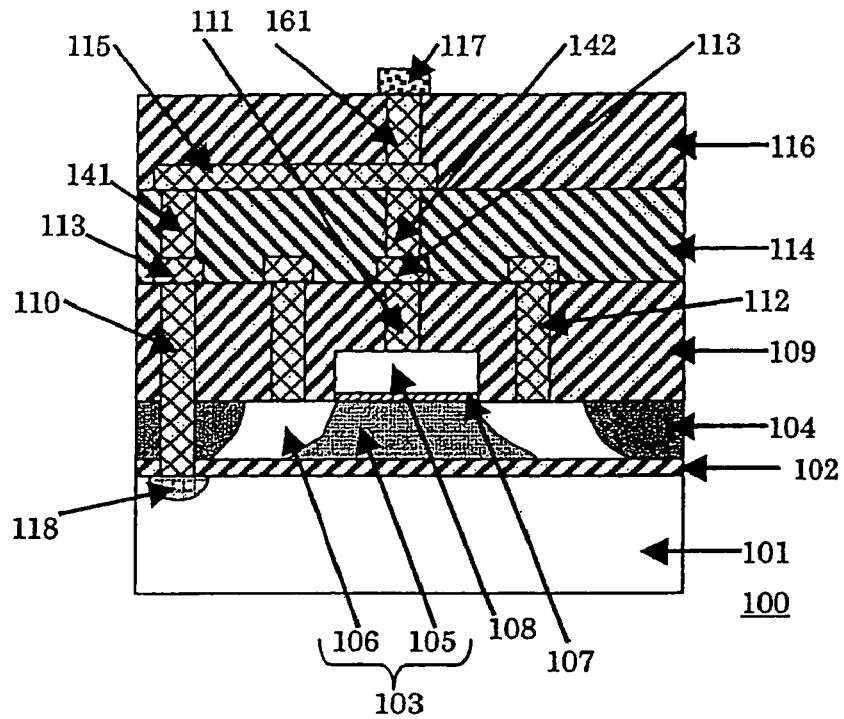
FIG. 1 is a sectional view of a semiconductor device according to a first embodiment of the invention.

FIG. 1 is a sectional view of a semiconductor device according to a first embodiment of the invention. Referring to FIG. 1, the structure of the semiconductor device of this embodiment will be described. The semiconductor device, generally denoted at 100, has a semiconductor layer 103 and device isolating regions 104 formed on a support substrate 101 made of silicon or the like, with a first insulating layer (hereinafter, referred to as a buried oxide layer) 102 therebetween. The semiconductor layer 103 includes a channel region 105 and diffusion regions (i.e., electrode regions) 106 that sandwich the channel region 105. On the channel region 105 of the semiconductor layer 103, a gate electrode 108 is formed via a second insulating layer (hereinafter, referred to as a gate insulating layer) 107. A third insulating layer (hereinafter, referred to a first interlayer insulating layer) 109 is formed on the device isolating regions 104, the semiconductor layer 103, and the gate electrode 108. A first conductor 110 passes through the first interlayer insulating layer 109, the device isolating regions 104, and the buried oxide layer 102 into electrical conduction with the support substrate 101. Also formed is a second conductor 111 that passes through the first interlayer insulating layer 109 into electrical conduction with the gate electrode 108, and a third conductor 112 that passes through the first interlayer insulating layer 109 into electrical conduction with the diffusion regions 106 of the semiconductor layer 103. A first wiring layer 113 is formed on the first interlayer insulating layer 109. The first wiring layer 113 connects a desired second conductor 111 and third conductor 112 to form a desired circuit. An uppermost-layer wiring 115 is formed on a fourth insulating layer (hereinafter, referred to as a second interlayer insulating layer) 114 formed on the first wiring layer 113 and the first interlayer insulating layer 109. The first conductor 110 electrically connected to the support substrate 101 is electrically connected to the second conductor 111 or the third conductor 112 via the uppermost-layer wiring 115. A fifth insulating layer (hereinafter, referred to as a third interlayer insulating layer) 116 is formed on the uppermost-layer wiring 115. An external terminal 117 formed on the third interlayer insulating layer 116 and the uppermost-layer wiring 115 are electrically connected to each other. The support substrate 101 is generally connected with a ground potential via the external terminal 117. In this embodiment, the external terminal 117 is an electrode pad, to which an external potential is input by wire bonding or the like.

Figure 3A:
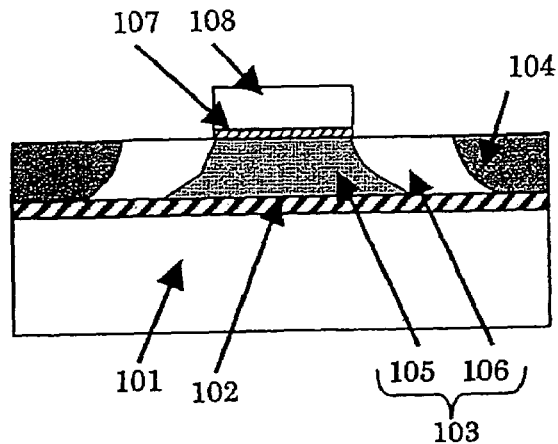
FIGS. 3A to 3F are process drawings of a method for manufacturing the semiconductor device according to the first embodiment of the invention.

The above-described semiconductor device 100 that includes the SOI structure is manufactured by the following process, for example. Referring to FIGS. 3A to 3F, a method for manufacturing the semiconductor device 100 will be described. As shown in FIG. 3A, the support substrate 101 on which the semiconductor layer 103 is formed via the buried oxide layer 102 is prepared (the semiconductor layer 103, the buried oxide layer 102, and the support substrate 101 are collectively referred to as an SOI substrate). The semiconductor layer 103 is divided into regions by the device isolating regions 104 formed in the semiconductor layer 103 using the techniques of local oxidation of silicon (LOCOS) or shallow trench isolation (STI). The gate insulating layer 107 is formed on the semiconductor layer 103 by, for example, thermal oxidation. Then, for example, polysilicon is deposited on the device isolating regions 104, the semiconductor layer 103, and the gate insulating layer 107. The polysilicon is then patterned by photolithography to thereby form the gate electrode 108 on the gate insulating layer 107. An impurity is implanted into the diffusion regions 106 of the semiconductor layer 103, whereby the formation of an SOI transistor is completed.

Figure 3B:
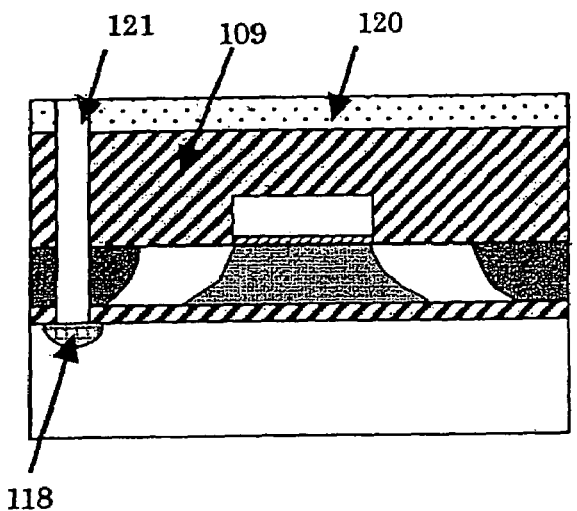
Figure 3C:
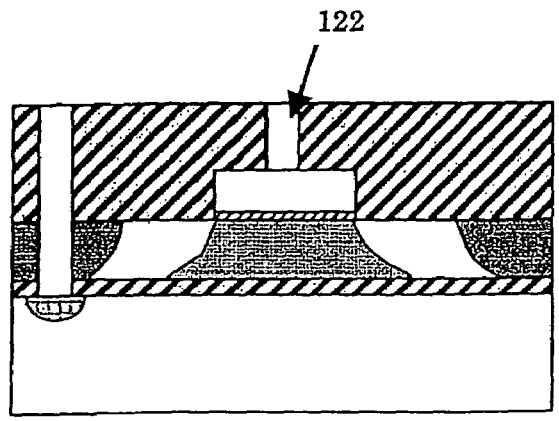

Referring now to FIG. 3B, the first interlayer insulating layer 109 is deposited on the device isolating regions 104, the semiconductor layer 103, and the gate electrode 108 by CVD or the like. After the deposition of the first interlayer insulating layer 109, a resist 120 is applied onto the first interlayer insulating layer 109, which is then subjected to known dry etching or the like to form a contact hole 121 which extends to the support substrate 101 through the device isolating region 104. To reduce the resistance of the contact portion, impurity is implanted in the contact hole 121, whereby a high-concentration implanted region 118 is formed in the portion of the support substrate 101 at the bottom of the contact hole 121. In this case, the concentration of the impurity implanted to the support substrate 101 is, for example, on the order of $1 \times 10^{20-21}$ ions/cm$^3$. Referring to FIG. 3C, a contact hole 122 that extends to the diffusion regions 106 and the gate electrode 108 is formed, and the resist 120 is then removed. Since the contact hole 121 generally has a depth of about 0.6 to 1.0 μm, it is preferable to set the diameter of the contact hole 121 about half of the height thereof so that ion species reach the bottom of the contact hole 121.

Figure 3D:
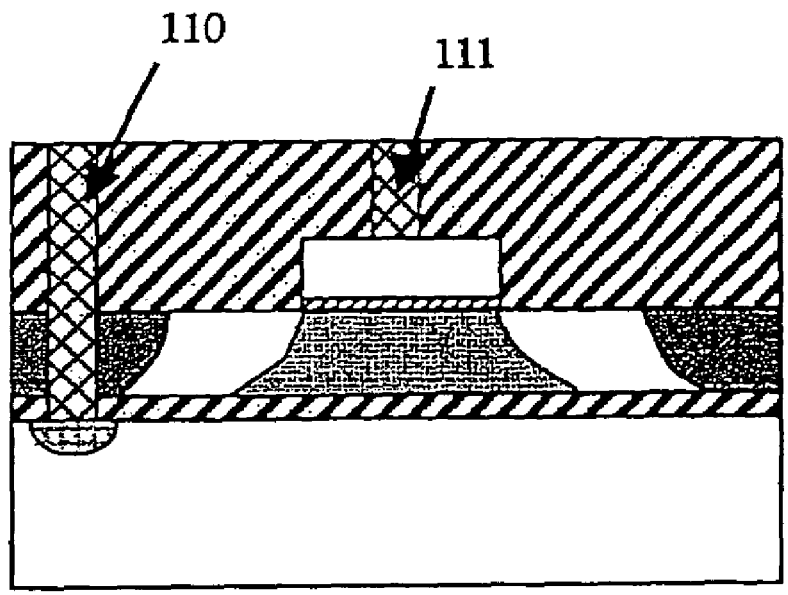

Referring to FIG. 3D, tungsten (W) or the like is deposited in the contact holes 121 and 122 to form the first conductor 110 which is in electrical conduction with the high-concentration implanted region 118 of the support substrate 101, which is formed before, the second conductor 111 which is in electrical conduction with the gate electrode 108, and the third conductor 112 which is in electrical conduction with the diffusion regions 106 of the semiconductor layer 103. Excessive tungsten (W) is removed by etch back or the like.

Figure 3E:
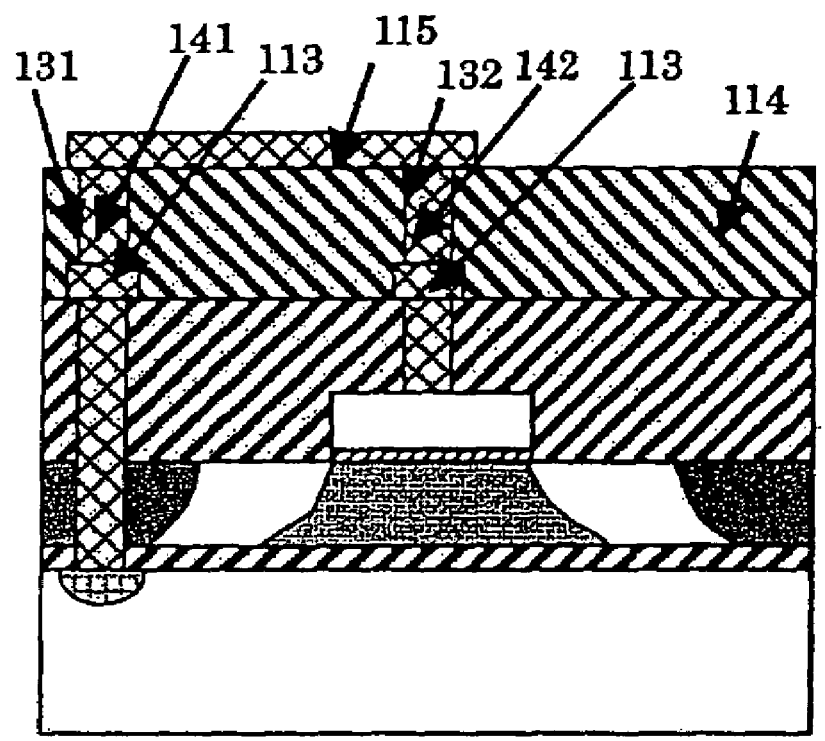
Figure 3F:
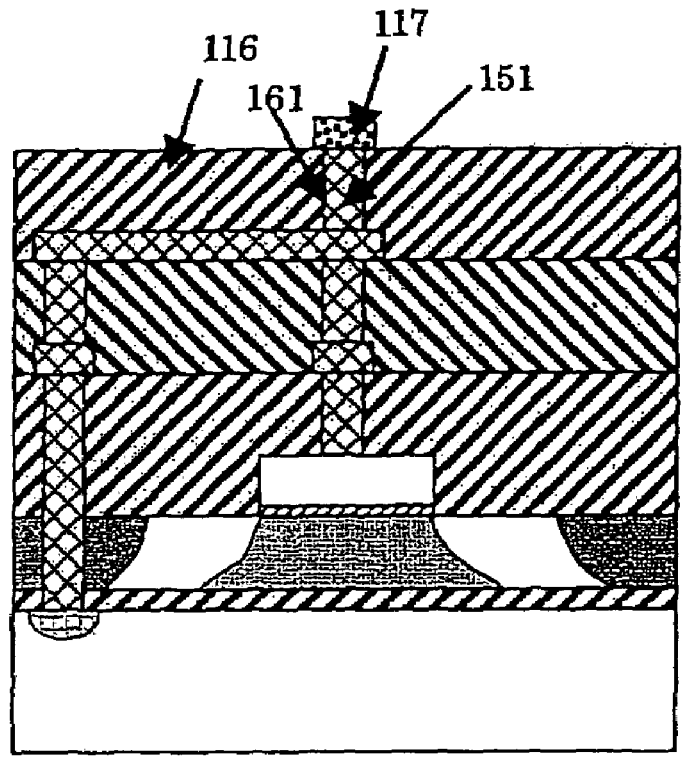

Referring to FIG. 3E, a metal layer made of aluminum or an aluminum alloy is deposited on the first interlayer insulating layer 109, the first conductor 110, the second conductor 111, and the third conductor 112 by sputtering or the like. The metal layer is then patterned by photolithography to form the first wiring layer 113. The second interlayer insulating layer 114 is then deposited on the first interlayer insulating layer 109 and the first wiring layer 113 by, for example, CVD. After the deposition of the second interlayer insulating layer 114, a resist is applied onto the second interlayer insulating layer 114, which is then subjected to known dry etching or the like to form a contact hole 131 which extends to the first conductor 110. A contact hole 132 that extends to the first wiring layer 113 is also formed. Tungsten (W) or the like is deposited in the contact holes 131 and 132 to form a fourth conductor 141 and a fifth conductor 142, respectively. Excessive tungsten (W) is removed by etch back or the like. A metal layer made of aluminum or an aluminum alloy is deposited on the second interlayer insulating layer 114, the fourth conductor 141, and the fifth conductor 142 by sputtering or the like. The metal layer is then patterned by photolithography to form the uppermost-layer wiring 115, thereby establishing the electrical conduction between the fourth conductor 141 and the fifth conductor 142.

The third interlayer insulating layer 116 is deposited on the second interlayer insulating layer 114 and the uppermost-layer wiring 115 by, for example, CVD. After the deposition of the third interlayer insulating layer 116, a resist is applied onto the third interlayer insulating layer 116, which is then subjected to known dry etching or the like to form a contact hole 151 which extends to the uppermost-layer wiring 115. Tungsten (W) or the like is deposited in the contact hole 151 to form a sixth conductor 161. Excessive tungsten (W) is removed by etch back or the like. A metal layer made of aluminum or an aluminum alloy is deposited on the third interlayer insulating layer 116 and the sixth conductor 161 by sputtering or the like. The metal layer is then patterned by photolithography to form the external terminal 117. The external terminal 117 in this embodiment is an electrode pad.

With the structure of the semiconductor device 100 and the method for manufacturing the same according to this embodiment, the electrical conduction between the support substrate 101 and the second conductor 111 is made through the uppermost-layer wiring 115. This prevents the charge generated in the support substrate 101 in the steps prior to the step of forming the uppermost-layer wiring 115 from reaching the SOI transistor. Even if the charge is generated in the steps following the step of forming the uppermost-layer wiring 115, the characteristic variations of the SOI transistor can be reduced in comparison with the related art.

Second Embodiment

Figure 2:
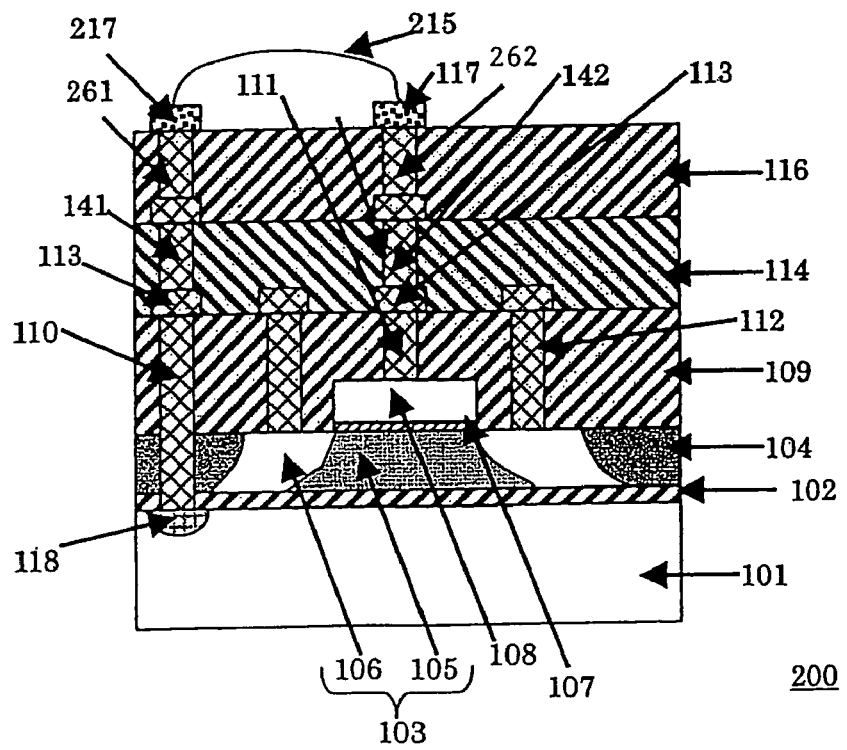
FIG. 2 is a sectional view of a semiconductor device according to a second embodiment of the invention.

FIG. 2 is a sectional view of a semiconductor device according to a second embodiment of the invention. Referring to FIG. 2, the structure of the semiconductor device, denoted at 200, will be described, in which the same numerals will be given for the same elements as those of the first embodiment.

Since structures below the second interlayer insulating layer 114 are the same as the first embodiment, their description will be omitted. The third interlayer insulating layer 116 is formed on the second interlayer insulating layer 114, the fourth conductor 141, and the fifth conductor 142. A sixth conductor 262 passes through the third interlayer insulating layer 116 into electrical conduction with the fifth conductor 142. A seventh conductor 261 passes through the third interlayer insulating layer 116 into electrical conduction with the fourth conductor 141. A first external terminal 117 is formed on the sixth conductor 262. A second external terminal 217 is formed on the seventh conductor 261. In this embodiment, the first external terminal 117 and the second external terminal 217 are both electrical pads. The first external terminal 217 and the second external terminal 227 are electrically connected by wire bonding 215.

Figure 4D:
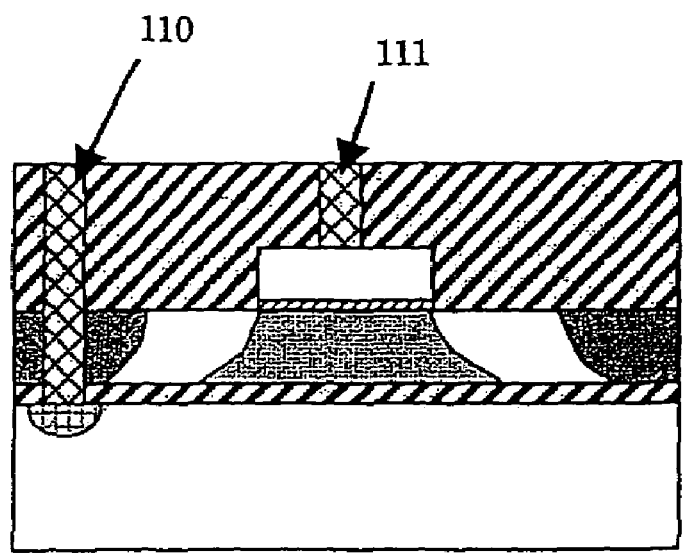
FIGS. 4D to 4F are process drawings of a method for manufacturing the semiconductor device according to the second embodiment of the invention.
Figure 4E:
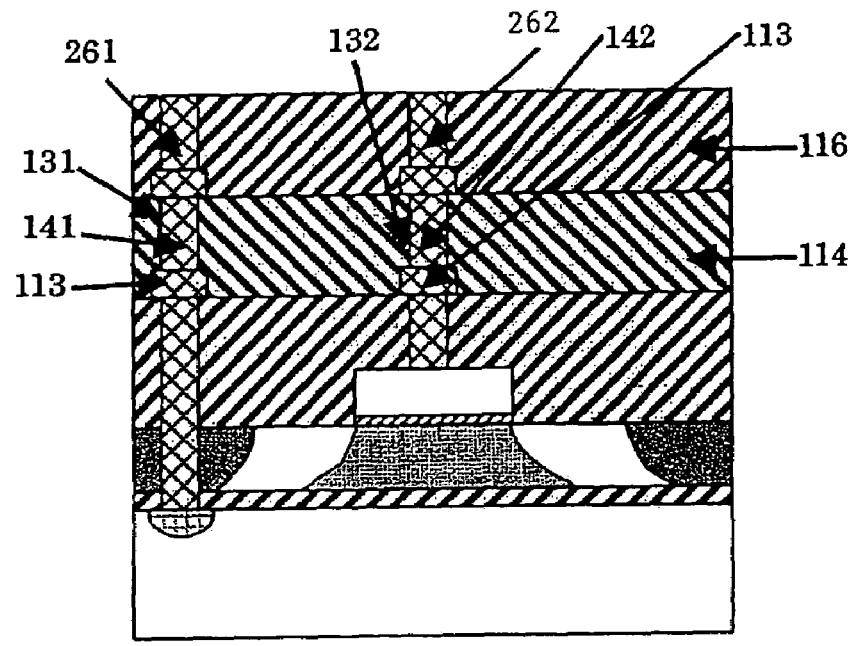
Figure 4F:
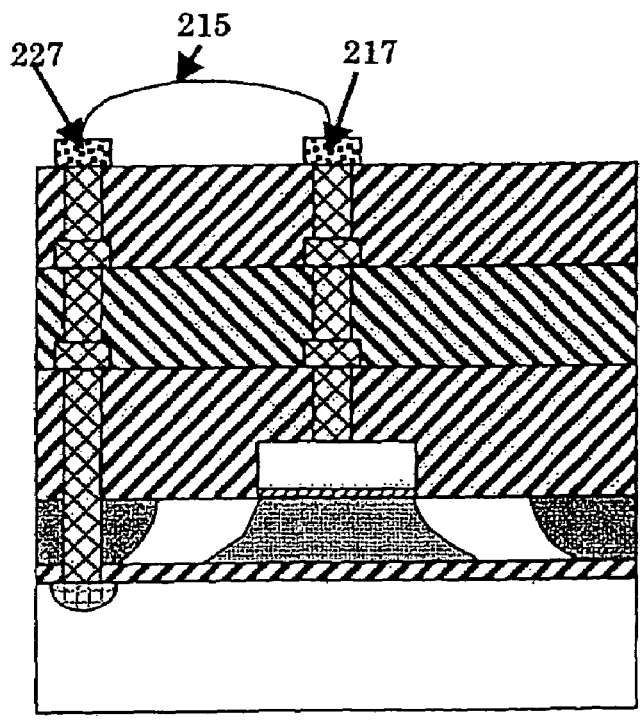

The semiconductor device 200 having the SOI structure according to the second embodiment is manufactured by the following process, for example. Referring to FIGS. 4D to 4F, a method for manufacturing the semiconductor device 200 will be described. Since the steps prior to that of FIG. 4D are the same as the manufacturing method of the first embodiment, their description will be omitted.

Referring to FIG. 4D, tungsten (W) or the like is deposited in the contact holes 121 and 122 to form the first conductor 110 that is in electrical conduction with the high-concentration implanted region 118 of the support substrate 101, which is previously formed, the second conductor 111 which is in electrical conduction with the gate electrode 108, and the third conductor 112 which is in electrical conduction with the diffusion regions 106 of the semiconductor layer 103. Excessive tungsten (W) is removed by etch back or the like.

Referring to FIG. 4E, a metal layer made of aluminum or an aluminum alloy is deposited on the first interlayer insulating layer 109, the first conductor 110, the second conductor 111, and the third conductor 112 by sputtering or the like. The metal layer is then patterned by photolithography to form the first wiring layer 113. The second interlayer insulating layer 114 is deposited on the first interlayer insulating layer 109 and the first wiring layer 113 by, for example, CVD. After the deposition of the second interlayer insulating layer 114, a resist is applied onto the second interlayer insulating layer 114, which is then subjected to known dry etching or the like to form the contact hole 131 which extends to the first conductor 110. The contact hole 132 that extends to the first wiring layer 113 is also formed. Tungsten (W) or the like is deposited in the contact holes 131 and 132 to form the fourth conductor 141, and the fifth conductor 142. Excessive tungsten (W) is removed by etch back or the like.

The third interlayer insulating layer 116 is deposited on the second interlayer insulating layer 114, the fourth conductor 141, and the fifth conductor 142 by, for example, CVD. After the deposition of the third interlayer insulating layer 116, a resist is applied onto the third interlayer insulating layer 116 to form contact holes that extend to the fourth conductor 141 and the fifth conductor 142, respectively, by known dry etching or the like. Tungsten (W) or the like is deposited in the contact holes to form the sixth conductor 262 and the seventh conductor 261. Excessive tungsten (W) is removed by etch back or the like.

Referring to FIG. 4F, a metal layer made of aluminum or an aluminum alloy is deposited on the third interlayer insulating layer 116, the sixth conductor 262, and the seventh conductor 261 by sputtering or the like. The metal layer is then patterned by photolithography to form the first external terminal 217 and the second external terminal 227. The first external terminals 217 and the second external terminals 227 in this embodiment are both electrode pads.

With the structure of the semiconductor device 200 and the method for manufacturing the same according to this embodiment, the electrical conduction between the support substrate 101 and the second conductor 111 is made by wire bonding 215. This prevents the charge generated in the support substrate 101 in the steps prior to the step of forming the wire bonding 215 from reaching the SOI transistor. Even if the charge is generated in the steps following the step of forming the wire bonding 215, the characteristic variations of the SOI transistor can be reduced in comparison with the related art.

Third Embodiment

Figure 5:
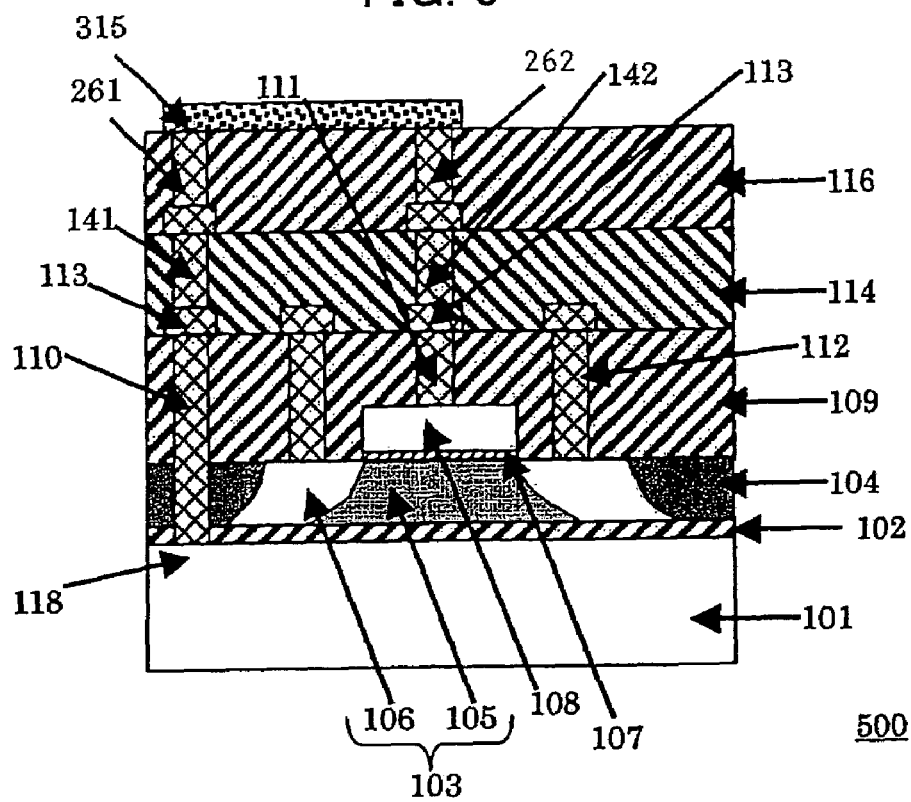
FIG. 5 is a sectional view of a semiconductor device according to a third embodiment of the invention.

FIG. 5 is a sectional view of a semiconductor device, denoted at 500, according to a third embodiment of the invention. The characteristics of this embodiment will be described in comparison with the second embodiment. In the second embodiment, the connection between the first external terminal 217 and the second external terminal 227 is made by the wire bonding 215. In contrast, in this embodiment, the first external terminal 217 and the second external terminal 227 are formed in an integrated manner. The electrical connection between the sixth conductor 262 and the seventh conductor 261 are therefore made through the common external terminal 315.

The structure of the semiconductor device 500 according to this embodiment provides similar advantages to those of the second embodiment while eliminating the step of wire bonding that is necessary in the second embodiment. The manufacturing process is therefore simplified to reduce manufacturing cost.

Fourth Embodiment

Figure 6:
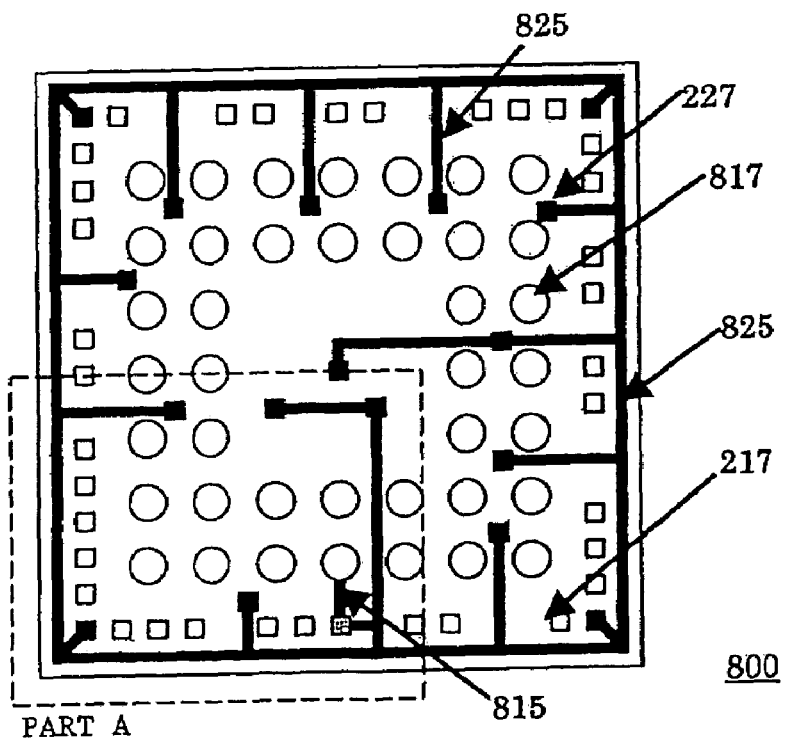
FIG. 6 is a top view of a semiconductor device according to a fourth embodiment of the invention.
Figure 7:
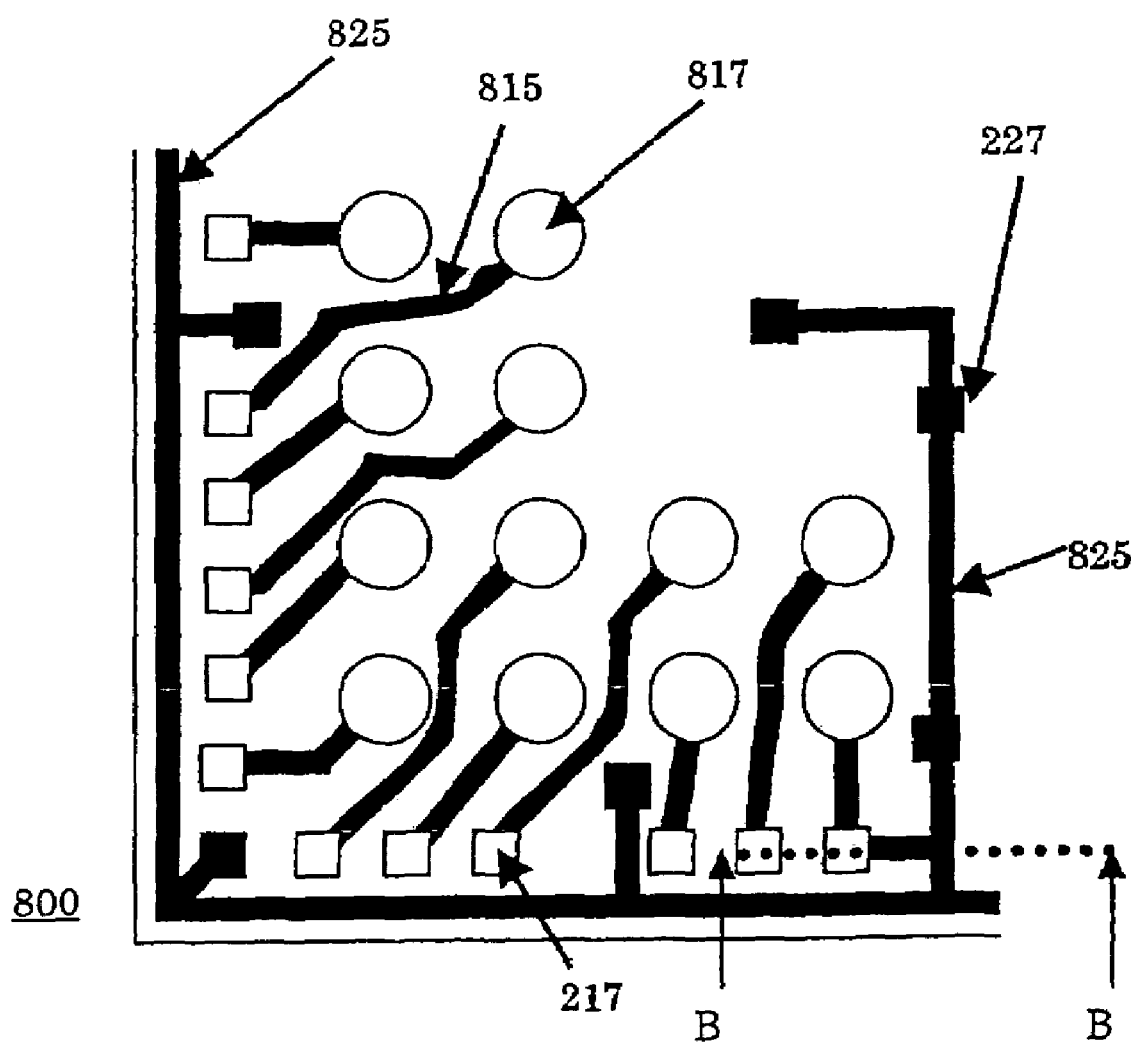
FIG. 7 is an enlarged view of part A in FIG. 6.
Figure 8:
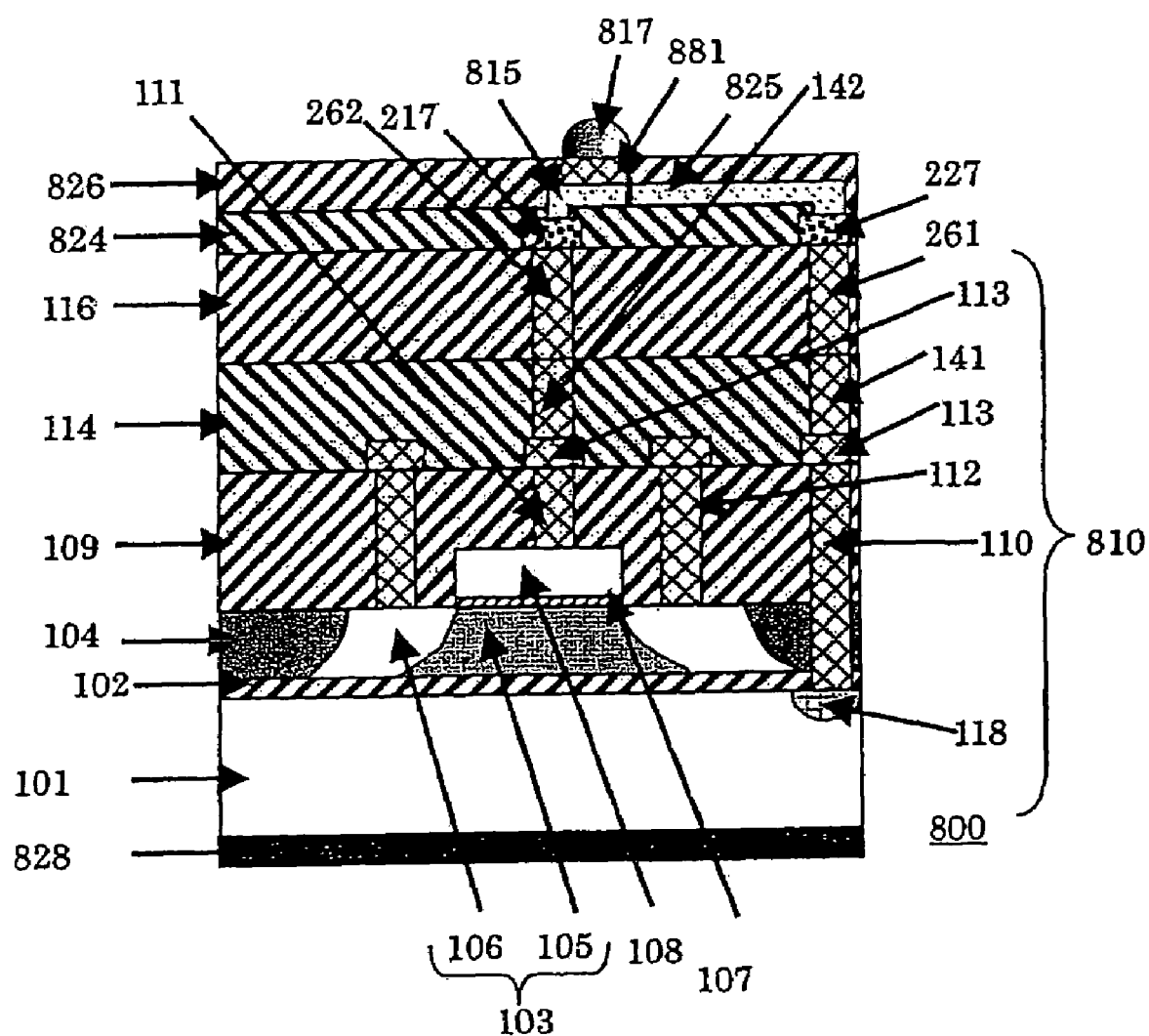
FIG. 8 is a sectional view taken along line B-B' of FIG. 7.

FIG. 6 is a top view of a semiconductor device according to a fourth embodiment of the invention. FIG. 7 is an enlarged view of part A in FIG. 6. FIG. 8 is a sectional view taken along line B-B' of FIG. 7. The fourth embodiment will be specifically described with reference to each figures.

Referring to FIG. 8, the semiconductor device, generally denoted at 800, has the semiconductor layer 103 and the device isolating regions 104 formed on the support substrate 101 made of silicon or the like, with the first insulating layer (hereinafter, referred to as a buried oxide layer) 102 therebetween. The semiconductor layer 103 includes the channel regions 105 and the diffusion regions 106 that sandwich the channel region 105. On the channel region 105 of the semiconductor layer 103, the gate electrode 108 is formed via the second insulating layer (hereinafter, referred to as a gate insulating layer) 107. The third insulating layer (hereinafter, referred to as a first interlayer insulating layer) 109 is formed on the device isolating regions 104, the semiconductor layer 103, and the gate electrode 108. The first conductor 110 passes through the first interlayer insulating layer 109, the device isolating region 104, and the buried oxide layer 102 into electrical conduction with the support substrate 101. A high-concentration implanted region 118 is formed in the portion of the support substrate 101 directly under the first conductor 110. In this case, the concentration of the impurity implanted to the support substrate 101 is, for example, on the order of $1 \times 10^{20-21}$ ions/cm$^3$.

Also formed is the second conductor 111 that passes through the first interlayer insulating layer 109 into electrical conduction with the gate electrode 108, and the third conductor 112 that passes through the first interlayer insulating layer 109 into electrical conduction with the diffusion regions 106 of the semiconductor layer 103. The first wiring layer 113 is formed on the first interlayer insulating layer 109. The first wiring layer 113 connects a desired second conductor 111 and third conductor 112 to form a desired circuit. The fourth insulating layer (hereinafter, referred to as a second interlayer insulating layer) 114 is formed on the first wiring layer 113 and the first interlayer insulating layer 109. The fourth conductor 141 passes through the second interlayer insulating layer 114 into electrical conduction with the first conductor 110. The fifth conductor 142 passes through the second interlayer insulating layer 114 into electrical conduction with the second conductor 111 or the third conductor 112.

The third interlayer insulating layer 116 is formed on the second interlayer insulating layer 114, the fourth conductor 141, and the fifth conductor 142. The sixth conductor 262 passes through the third interlayer insulating layer 116 into electrical conduction with the fifth conductor 142. The seventh conductor 261 passes through the third interlayer insulating layer 116 into electrical conduction with the fourth conductor 141. The first external terminal 217, or a first electrode pad, is formed on the sixth conductor 262. The second external terminal 227 or a second electrode pad is formed on the seventh conductor 261. The third interlayer insulating layer 116 and the elements thereunder are collectively called a semiconductor chip 810.

A protective layer 824 is formed on the third interlayer insulating layer 116 in such a manner that the upper surfaces of the first external terminal 217 and the second external terminal 227 are exposed. A first uppermost-layer wiring 815 and a second uppermost-layer wiring 825 are formed on the protective layer 824. The first uppermost-layer wiring 815 is in electrical connection with the first external terminal 217. The second uppermost-layer wiring 825 is in electrical connection with the second external terminal 227. A sealing resin 826 is formed on the first uppermost-layer wiring 815, the second uppermost-layer wiring 825, and the protective layer 824. An eighth conductor 881 passes through the sealing resin 826 into electrical connection with the first uppermost-layer wiring 815. An external terminal (hereinafter, referred to as a bump) 817 is formed on the eighth conductor 881. A conductive layer 828 is formed on the back surface (hereinafter, referred to as a second surface) of a semiconductor chip 810. Examples of the conductive layer 828 are a metallized layer, a metal plating, a conductive paste, and a conductive sheet.

As shown in FIGS. 6 and 7, the semiconductor chip 810 has, thereon, a first region along the rim of the first surface of the semiconductor chip 810 and a second region surrounded by the first region. The first external terminal 217 or the first electrode pad is formed in the first region, while the second external terminal 227 or the second electrode pad is formed in the second region. The first external terminal 217 connects to an inner circuit, while the second external terminal 227 electrically connects to the support substrate 101 of the semiconductor chip 810.

The bump 817 formed on the semiconductor chip 810 connects with the first external terminal 217 via the first uppermost-layer wiring 815 formed on the semiconductor chip 810. The second uppermost-layer wiring 825 is formed between the end of the first surface of the semiconductor chip 810 and the first external terminal 217. The second uppermost-layer wiring 825 surrounds the first external terminals 217. The second uppermost-layer wiring 825 is electrically connected to the second external terminal 227. When there is a plurality of second external terminals 227, all the second external terminals 227 are electrically connected at the same fixed potential by the second uppermost-layer wiring 825. In the semiconductor device 800 of this embodiment, the second uppermost-layer wiring 825 is fixed to a ground potential. Accordingly, of the first external terminals 217, those connected to the ground potential and the second external terminals 227 are electrically connected by the second uppermost-layer wiring 825.

With the structure of this embodiment, since the first external terminal 217 and the second external terminal 227 are electrically connected by the second uppermost-layer wiring 825, as in the second embodiment, the charge generated in the support substrate 101 in the steps prior to the step of electrically connecting the first external terminal 217 and the second external terminal 227 does not reach the SOI transistor. This prevents the breakage or degradation of the gate insulating layer of the SOI transistor.

Providing the second uppermost-layer wiring 825 between the end of the first surface of the semiconductor chip 810 and the first external terminal 217 enables wirings of the same potential to be routed over the semiconductor chip 810 without the need for new space for wiring.

Providing the conductive layer 828 on the second surface of the semiconductor chip 810 enables the potential of the support substrate 101 to be made even. In other words, it can reduce the variations of the potential due to the distance from the joint portion of the support substrate 101 and the first conductor 110. This enables the characteristic variations of the SOI transistor to be reduced.

Figure 9:
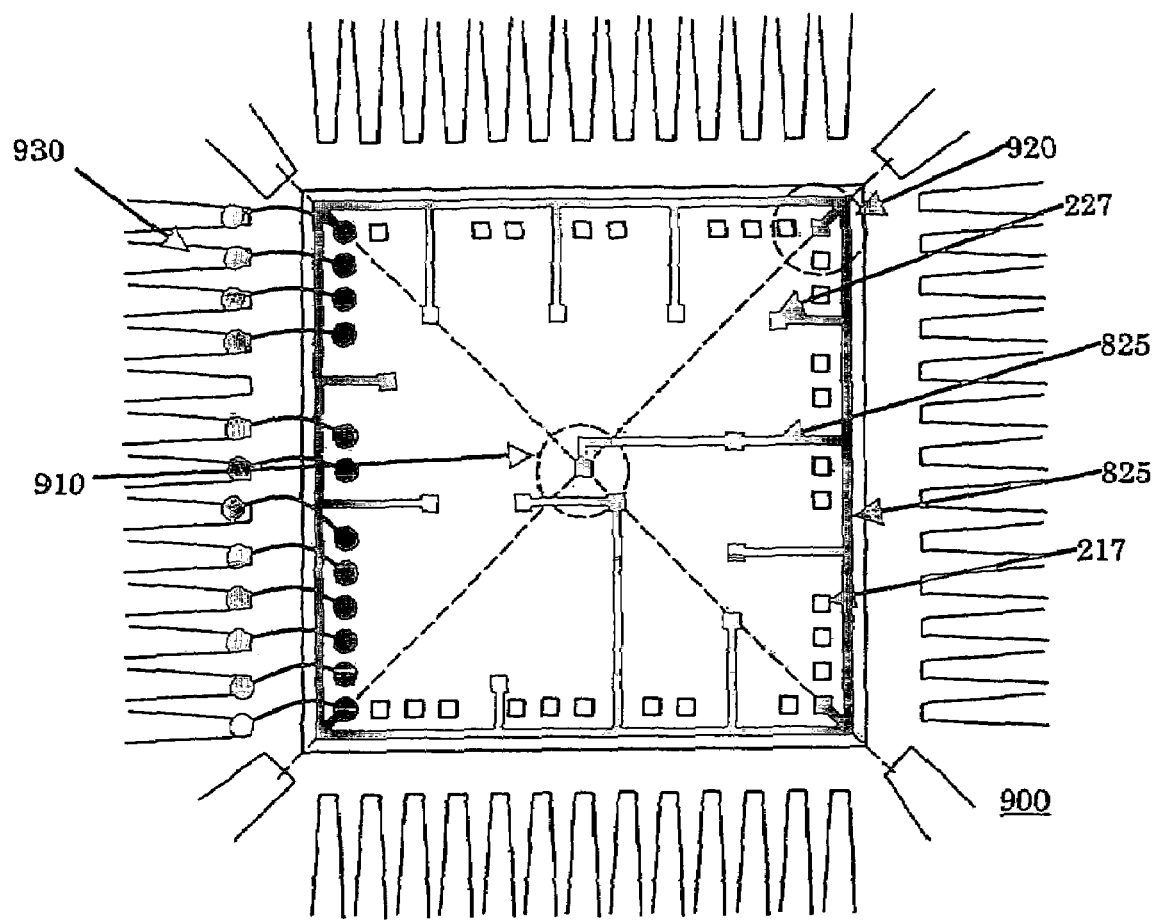
FIG. 9 is a top view of a modification of the semiconductor device according to the fourth embodiment of the invention.

FIG. 9 is a top view of a modification of the semiconductor device 800 of the fourth embodiment of the invention. The semiconductor chip 810 has the same structure as that described above. More specifically, the second external terminal 227 is formed at an intersection point 910 of the diagonal lines of the semiconductor chip 810. The second external terminal 227 is formed also at a corner portion 920 of the semiconductor chip 810.

The semiconductor device, denoted at 900, has a lead frame 930. The first external terminal 217 and the lead frame 930 are connected by wire bonding. The second external terminal 227 formed at the corner portion 920 are also connected to the lead frame 930 by wire bonding.

With the structure of the modification of the embodiment, provision of the second external terminal 227 at least at the intersection point 910 of the diagonal lines of the semiconductor device 900 makes the distribution of the fixed potentials of the support substrate 101 of the semiconductor chip 810 even, depending on the distance from the point 910. The providing of the second external terminal 227 at the corner portion 920 of the semiconductor chip 810 eliminates the need for a dedicated space therefor. Providing the second external terminals 227 at all four corner portions 920 of the semiconductor chip 810 enables the fixed potentials to be even depending on the distance from the intersection point 910 of the diagonal lines of the semiconductor device 900. Providing the second external terminals 227 at the four corner portions 920 of the semiconductor chip 810 and the intersection point 910 of the diagonal lines thereof enables fixing of potentials to be even.

In the semiconductor device 900 of the modification of the embodiment, the connection among the first external terminal 217, the second external terminal 227, and the lead frame 930 is made by wire bonding. This enables the characteristic variations of the SOI transistor to be minimized, and prevents the breakage of the SOI transistor in wire bonding process.

Fifth Embodiment

Figure 10:
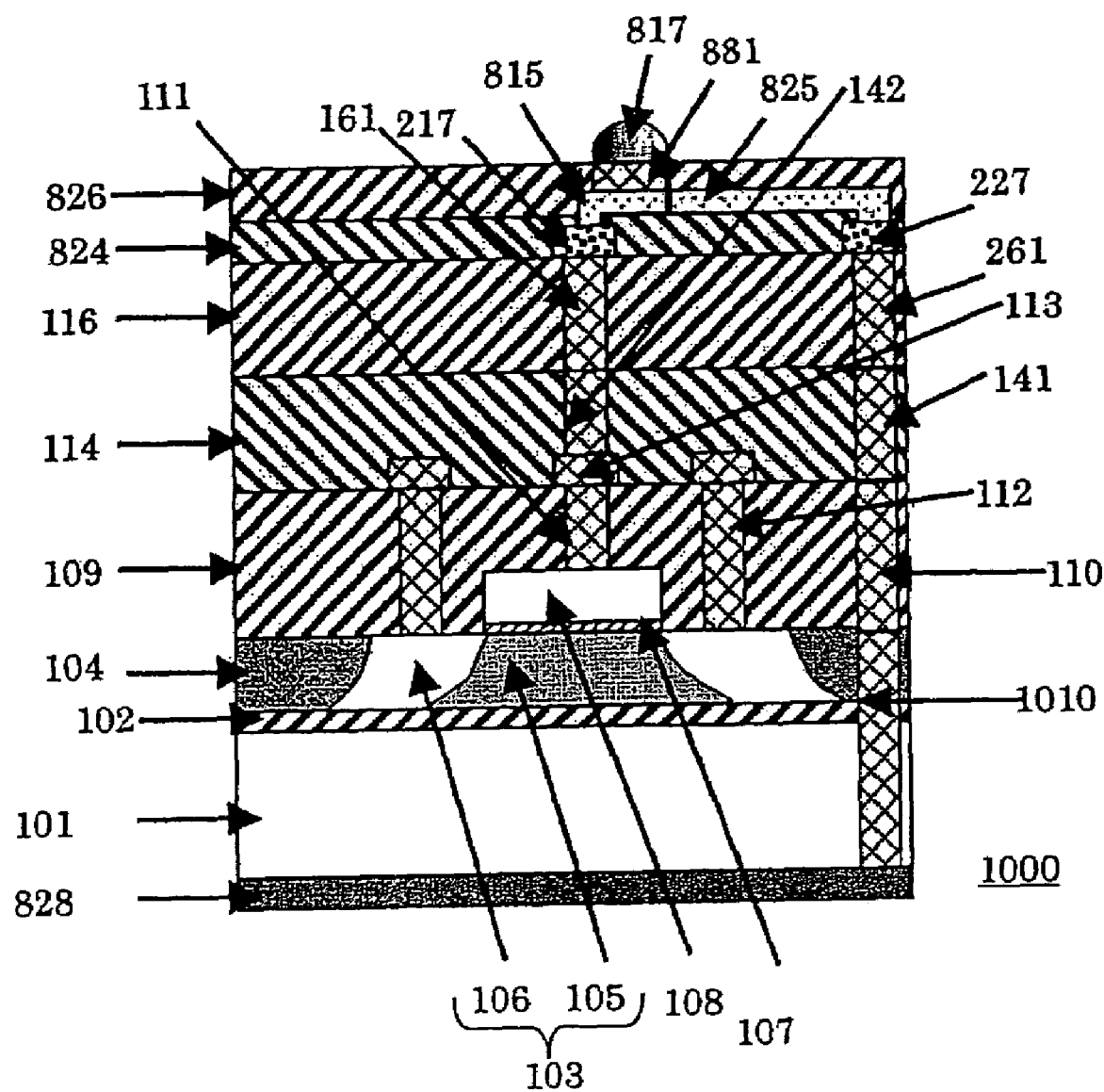
FIG. 10 is a sectional view of a semiconductor device according to a fifth embodiment of the invention.

FIG. 10 is a sectional view of a semiconductor device 1000 according to a fifth embodiment of the invention, in which the same numerals will be given for the same elements as those of the fourth embodiment, and their description will be omitted.

In the fourth embodiment, the electrical connection between the second external terminal 227 and the support substrate 101 is made via the first conductor 110 passing through the first interlayer insulating layer 109 and the device isolating region 104, the fourth conductor 141 passing through the second interlayer insulating layer 114, and the seventh conductor 261 passing through the third interlayer insulating layer 116.

In contrast, this embodiment has a through electrode 1010 passing through the support substrate 101, the buried oxide layer 102, and the device isolating region 104. The electrical connection between the second external terminal 227 and the support substrate 101 is made via the first conductor 110, the fourth conductor 141, and the seventh conductor 261 in electrical connection with the through electrode 1010. The conductive layer 828 formed on the second surface of the semiconductor chip 810 also enables connection with the second external terminal 227.

Figure 11A:
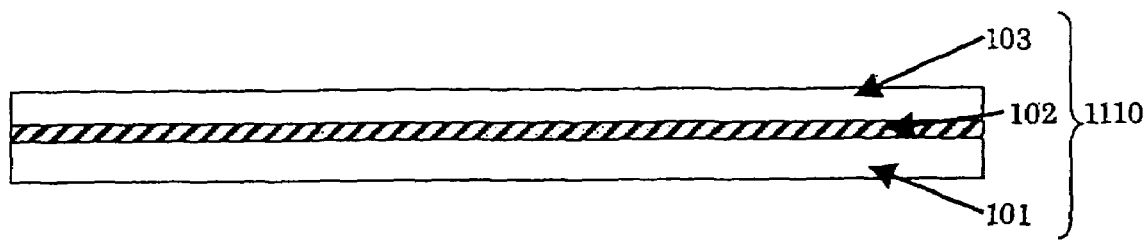
FIGS. 11A to 11F are process drawings of a method for manufacturing the semiconductor device according to the fifth embodiment of the invention.

Referring next to FIGS. 11A to 11F, a method for manufacturing the semiconductor device 1000 will be described. As shown in FIG. 11A, the buried oxide layer 102 is first formed on the support substrate 101, on which the semiconductor layer 103 is formed to thereby prepare an SOI wafer 1110.

Figure 11B:
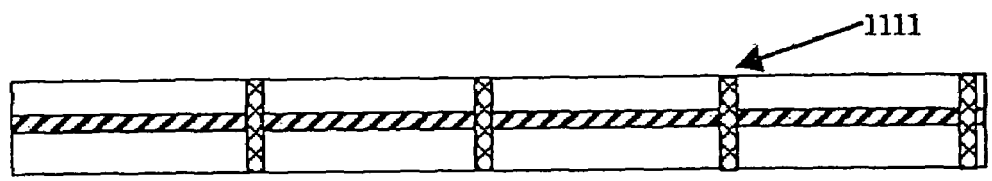

As shown in FIG. 11B, a through hole 121 passing through the SOI wafer 1110 is formed by sputtering or the like. The through electrode 1111 made of an alloy of copper or tin or the like is formed in the through holes by plating or implant of a conductive paste or a welded metal.

Figure 11C:
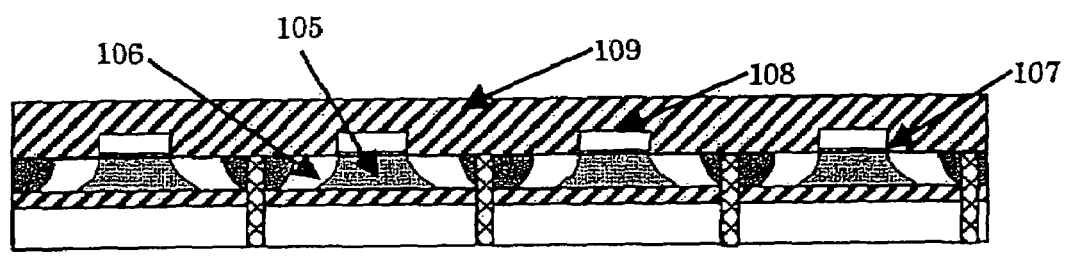

As shown in FIG. 11C, an SOI transistor that includes the gate insulating layer 107, the gate electrode 108, the channel region 105, and the diffusion regions 106 is formed by a known technique. The first interlayer insulating layer 109 is then formed on the SOI transistor.

Figure 11D:
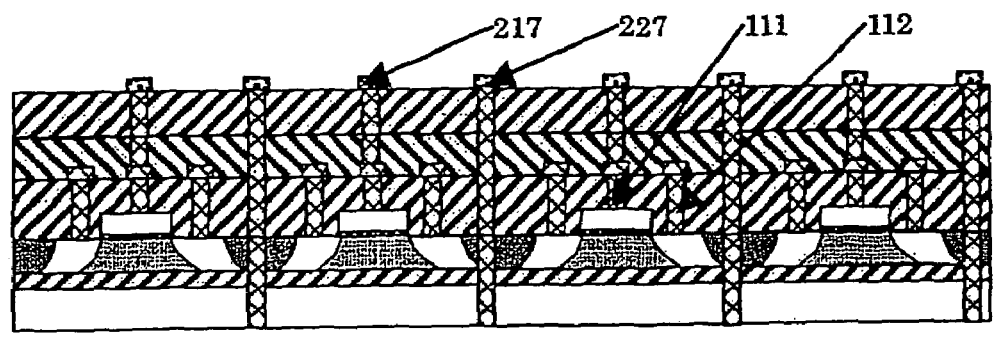

As shown in FIG. 11D, the second conductor 111 and the third conductor 112 in electrical connection with the SOI transistor are formed, and the first conductor 110 in electrical connection with the through electrode 1111 is also formed. Thereafter, the first external terminal 217 in electrical connection with the second conductor 111 and the second external terminal 227 in electrical connection with the first conductor 110 via a plurality of wiring layers and interlayer insulating layers are formed.

Figure 11E:
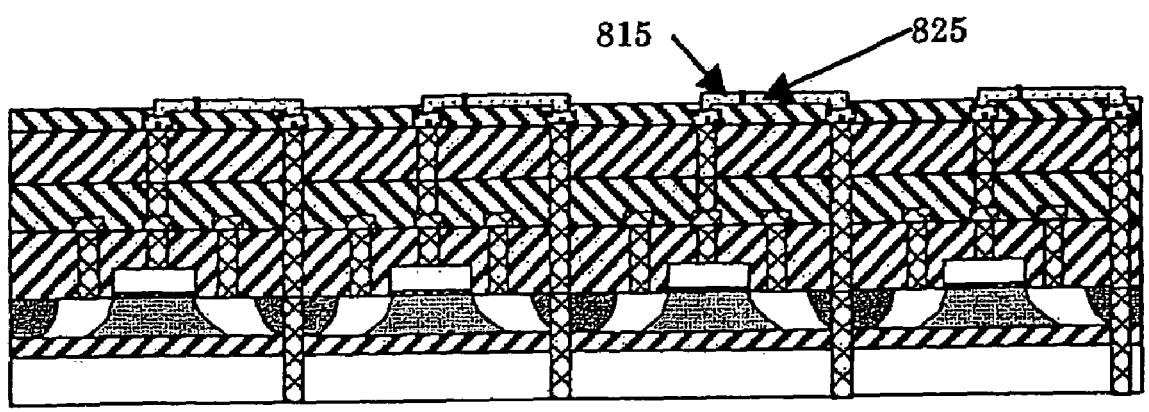

As shown in FIG. 11E, the first external terminal 217 and the second external terminal 227, in predetermined positions, are connected to each other by the second uppermost-layer wiring 825. When there is a plurality of the second external terminals 227, they are connected by the second uppermost-layer wiring 825. At the same time, the first uppermost-layer wiring 815 in connection with the first external terminal 217 is formed as necessary. However, as described in the modification of the fourth embodiment, to manufacture the lead-frame type semiconductor device, the first external terminal 217 and the second external terminal 227 are secured to the lead frame 930 by wire bonding (not shown). Accordingly, the process shifts from the step of FIG. 11E to an existing resin mold step.

Figure 11F:
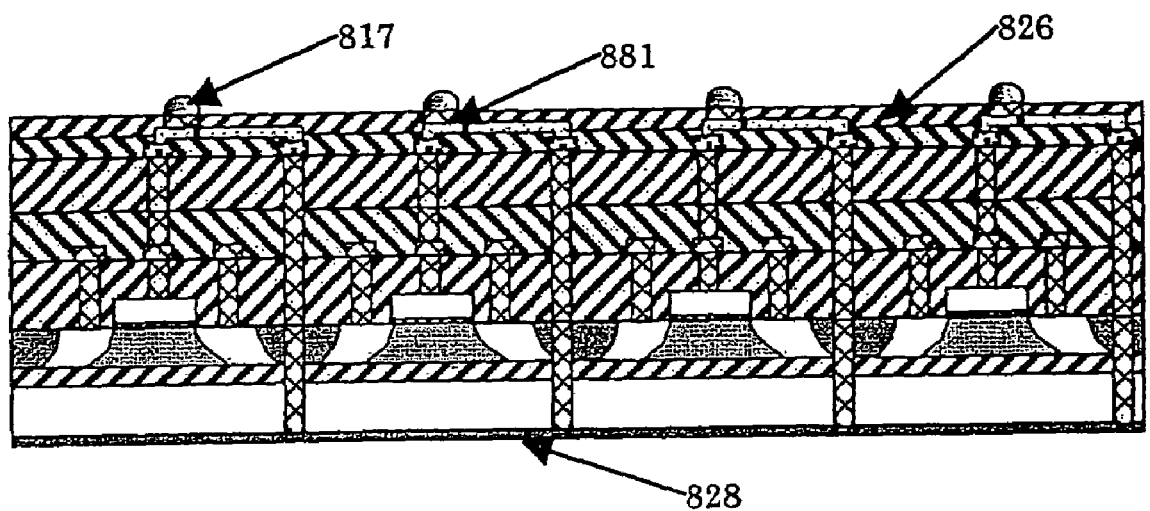

As shown in FIG. 11F, a protective layer or the like (not shown) is formed on the first uppermost-layer wiring 815 and then the eighth conductor 881 is formed thereon. The sealing resin 826 is formed so as to cover all of the first uppermost-layer wiring 815, the second uppermost-layer wiring 825, and the eighth conductor 881 on the SOI wafer 1110. The eighth conductor 881 is exposed by grinding the surface of the sealing resin 826, and then the bumps 817 are formed on the eighth conductor 881. The conductive layer 828 is formed on the support substrate 101 side or the back surface of the SOI wafer 1110. The conductive layer 828 is comprised of, for example, a metallized layer, a metal plating, a conductive paste, and a conductive sheet. Thereafter, the semiconductor chip is cut out from the SOI wafer by dicing or the like to complete the semiconductor device.

With the structure of this embodiment, the SOI transistor and the support substrate 101 are not electrically connected until they are connected by the first uppermost-layer wiring 815 and the second uppermost-layer wiring 825, as in the fourth embodiment. The charge generated in the steps prior to the step of forming the first uppermost-layer wiring 815 and the second uppermost-layer wiring 825 is not therefore input to the SOI transistor, thus preventing the breakage or degradation of the gate insulating layer 107 of the SOI transistor.

Provision of the second uppermost-layer wiring 825 between the end of the first surface of the semiconductor chip 810 and the first external terminal 217 enables wiring of the same potential to be routed over the semiconductor chip 810 without the need for new space for wiring.

The conductive layer 828 can be fixed at the same potential as that of the second external terminal 227 by the through electrode 1111. Since, in this embodiment, the potentials of the second external terminal 227 and the conductive layer 828 are fixed to a ground, the entire second surface of the semiconductor chip 810 is fixed to the ground potential. The support substrate 101 can thus be fixed at the ground potential without variations, thus reducing the characteristic variations of the SOI transistor.

According to the method for manufacturing of this embodiment, the first external terminal 217 electrically connected to the SOI transistor and the second external terminal 227 electrically connected to the support substrate 101 are not electrically connected during the WP process using plasma CVD or the like. Even if the electrical connection between the first external terminal 217 and the second external terminal 227 is established in AP process, manufacturing of this embodiment can be achieved without the step causing the characteristic variations of the SOI transistor.

The forming of the through electrode 1111 in the SOI wafer 1110 in the step of FIG. 11B, and the forming of the conductive layer 828 in the step of FIG. 11F allow the potential of the support substrate 101 to be fixed without variations.

In the present application, no method claim is claimed. However, the following claims may be claimed in a separate application.

A method for manufacturing a semiconductor device, comprising the steps of:
 preparing an SOI wafer;
 forming through holes in the SOI wafer;
 filling the through holes with conductors;
 forming a plurality of SOI transistors on the SOI wafer; and
 forming a first electrode pad electrically connected to each of the SOI transistors and a second electrode pad electrically connected to the conductors;
 wherein the SOI transistors are isolated from one another by device isolating regions including the through holes.

As another example, a method for manufacturing a semiconductor device, comprising the steps of:
 preparing an SOI wafer including a support substrate, a buried oxide layer, and a semiconductor layer;
 forming a plurality of SOI transistors on the SOI wafer;
 forming an interlayer insulating layer on the SOI transistors;
 forming a through conductor passing through the interlayer insulating layer and electrically connecting with the support substrate; and
 forming a first electrode pad electrically connected to the SOI transistor and a second electrode pad electrically connected to the through conductor;
 wherein the SOI transistors are isolated from one another by device isolating regions.

In the method for manufacturing the semiconductor device, the method further comprising the step of:
 forming an external terminal electrically connected to the first electrode pad.

Further, in the method for manufacturing the semiconductor device, the SOI transistor and the support substrate are electrically connected with each other only after the first electrode pad and the second electrode pad are electrically connected to each other.

What is claimed is:

1. A semiconductor device, comprising:
 a support substrate;
 a buried oxide layer formed on the support substrate;
 a semiconductor layer deposited on the buried oxide layer, the semiconductor layer including device isolating regions and a plurality of device regions isolated from each other by the device isolating regions, each of the plurality of device regions including a channel region and a pair of electrode regions opposed to each other with the channel region sandwiched therebetween;
 a gate electrode opposed to the channel region via a gate insulating layer to form a transistor in the device regions;
 an interlayer insulating layer covering the gate electrode and the semiconductor layer;
 a first through conductor passing through the interlayer insulating layer into an electrical connection with the gate electrode;
 a second through conductor passing through the interlayer insulating layer, the device isolating regions, and the buried oxide layer and extending to the support substrate; and
 a first electrode pad and a second electrode pad formed on the interlayer insulating layer and electrically connected to the first through conductor and the second through conductor, respectively;
 wherein a first region of the semiconductor device is provided along an end of the interlayer insulating layer and a second region of the semiconductor device is surrounded by the first region on the interlayer insulating layer, and
 wherein the first electrode pad is formed on the first region, and the second electrode pad is formed on the second region.

2. The semiconductor device according to claim 1, wherein the second electrode pad is formed in the center of the semiconductor device.

3. The semiconductor device according to claim 1, wherein the second electrode pad is formed at a corner portion of the semiconductor device.

4. The semiconductor device according to claim 1, further comprising a lead frame, wherein the second electrode pad is electrically connected with the lead frame.

5. The semiconductor device according to claim 4, wherein the electrical connection is by wire bonding.

6. The semiconductor device according to claim 1, further comprising
 an external terminal formed on the interlayer insulating layer and electrically connected to the first electrode pad via a first uppermost-layer wiring.

7. The semiconductor device according to claim 1, wherein the first electrode pad and the second electrode pad are electrically connected to each other by a second uppermost-layer wiring.

8. The semiconductor device according to claim 1, wherein a conductive layer is formed on the surface of the support substrate opposed to the interlayer insulating layer of the semiconductor device.

9. The semiconductor device according to claim 1, wherein a through electrode passes through the semiconductor device and is electrically connected with a conductive layer formed on the surface of the support substrate and is electrically connected to the second electrode pad.

10. A semiconductor device comprising:
a support substrate;
a buried oxide layer formed on the support substrate;
a semiconductor layer deposited on the buried oxide layer, the semiconductor layer including device isolating regions and a plurality of device regions isolated from each other by the device isolating regions, each of the plurality of device regions including a channel region and a pair of electrode regions opposed to each other with the channel region sandwiched therebetween;
a gate electrode opposed to the channel region via a gate insulating layer to form a transistor in the device regions;
an interlayer insulating layer covering the gate electrode and the semiconductor layer;
a first through conductor passing through the interlayer insulating layer into an electrical connection with the gate electrode;
a second through conductor passing through the interlayer insulating layer, the device isolating regions, and the buried oxide layer and extending to the support substrate; and
a first electrode pad and a second electrode pad formed on the interlayer insulating layer and electrically connected to the first through conductor and the second through conductor, respectively;
wherein the first electrode pad and the second electrode pad are electrically connected to each other by a second uppermost-layer wiring.

11. The semiconductor device according to claim 10, wherein a second uppermost-layer wiring is also formed between the first electrode pad and an end of the interlayer insulating layer of the semiconductor device.

12. The semiconductor device according to claim 10, wherein a second uppermost-layer wiring surrounds the first electrode pad along an end of the semiconductor device.

13. The semiconductor device according to claim 10, wherein a second uppermost-layer wiring is connected to a ground.

14. The semiconductor device according to claim 10, wherein a through electrode passes through the semiconductor device and is electrically connected with a conductive layer formed on the surface of the support substrate and is electrically connected to the second electrode pad.

* * * * *